United States Patent [19]
Jarvis

[11] Patent Number: 5,387,306
[45] Date of Patent: Feb. 7, 1995

[54] MANUFACTURING INTEGRATED CIRCUIT CARDS

[75] Inventor: Charles R. Jarvis, Bewdley, United Kingdom

[73] Assignee: GEC Avery Limited, Warley, United Kingdom

[21] Appl. No.: 750,597

[22] Filed: Aug. 28, 1991

Related U.S. Application Data

[63] Continuation-in-part of Ser. No. 473,981, Apr. 23, 1990, abandoned.

[30] Foreign Application Priority Data

Jun. 21, 1988 [GB] United Kingdom ............... 8814664
Jan. 19, 1989 [GB] United Kingdom ............... 8901189

[51] Int. Cl.⁶ .................... B29C 45/14; B29C 69/02
[52] U.S. Cl. .................................. 156/292; 156/293; 264/145; 264/157; 264/272.13; 264/272.14; 264/272.15; 264/272.17
[58] Field of Search ............. 264/272.17, 328.6, 157, 264/167, 272.14, 272.15, 145, 272.13; 425/112; 156/292, 293

[56] References Cited

U.S. PATENT DOCUMENTS

| | | | |
|---|---|---|---|
| 2,166,643 | 7/1939 | Salfisberg | 264/261 |
| 4,240,999 | 12/1980 | Decker, Jr. | 264/261 |
| 4,427,615 | 1/1984 | Eskesen | 264/261 |
| 4,746,392 | 5/1988 | Hoppe | 264/272.17 |
| 4,961,893 | 10/1990 | Rose | 264/272.17 |
| 5,030,309 | 7/1991 | Brignet et al. | 264/328.1 |

FOREIGN PATENT DOCUMENTS

| | | |
|---|---|---|
| 0173907 | 3/1986 | European Pat. Off. |
| 0231823 | 8/1987 | European Pat. Off. |
| 307665 | 3/1989 | European Pat. Off. |
| 0307665 | 3/1989 | European Pat. Off. |
| 1130736 | 10/1968 | United Kingdom |
| 1449684 | 9/1976 | United Kingdom |
| 1509738 | 5/1978 | United Kingdom |
| 2081974 | 2/1982 | United Kingdom |

Primary Examiner—Jan H. Silbaugh
Assistant Examiner—A. Y. Ortiz
Attorney, Agent, or Firm—Spencer, Frank & Schneider

[57] ABSTRACT

An integrated circuit card is manufactured by reaction injection moulding around the insert bearing the electronic components, and between high tensile skins which form opposed surfaces of the card. Apparatus is disclosed for the continuous manufacture of the cards between a pair of moving belts.

6 Claims, 3 Drawing Sheets

MANUFACTURING INTEGRATED CIRCUIT CARDS

CROSS-REFERENCE TO RELATED APPLICATION

This application is a continuation-in-part of copending application Ser. No. 07/473,981 filed Apr. 23, 1990, now abandoned.

FIELD OF THE INVENTION

This invention relates to a method of manufacturing integrated circuit cards.

BACKGROUND OF THE INVENTION

Injection moulding is often used as a method of manufacturing small plastic articles. In such methods, usually small granules of the plastics material are heated so as to melt the material and the resulting fluid is injected at high temperature and pressure, perhaps 300° C. and 2,000 PSI into a mould of a desired shape. The material is then allowed to set in the mould as it cools.

Such a method is satisfactory for the manufacture of small, homogeneous, articles. However, integrated circuit cards or "smart cards", which comprises a number of components such as electronic circuits, input/output interfaces, substrates and labels, are less well suited to the process, since the high pressures and temperatures involved tend to displace inserts and indeed can damage the functioning thereof. Smart cards are therefore generally manufactured by a lamination process or, in the case of contact cards, the electronic circuit is inserted into a recess formed in the surface of a plastic card.

SUMMARY OF THE INVENTION

According to the present invention there is provided a method of manufacturing an integrated circuit card comprising at least one electronic component and data input output means encapsulated within a plastics body and having high tensile members with graphics thereon disposed as skins on two opposing main faces of the body, the method comprising the steps of: locating said high tensile members against respective surfaces of a mould; locating said at least one electronic component in a predetermined position between said members; injecting a reaction injection mouldable plastics material into said mould so as to encapsulate said at least one component, said plastics material adhering to, and being prevented from contacting said surfaces of said mould by, said high tensile modulus members; allowing said plastics material to harden; and removing said card from said mould.

The card will typically have the dimensions of an ISO bank or credit card, i.e. 85 mm by 54 mm, with a thickness of 0.75 mm.

The card may be of the type which use contactless coupling by means of an inductive loop, encapsulated within the plastics or resin material, or the card may be of the contact type in which coupling with a card reader is achieved via an array of contacts on the surface of the card.

Preferably, said at least one electronic component is adhered to a surface of one of said high tensile members before said mouldable plastics material is injected. The method may comprise coating the internal face of at least one of said high tensile members with a heat-activatable adhesive, positioning said component on said member and heating said member to adhere said component thereto. The mould may be heated to accelerate harding of said plastics material. In the case of the contact type, one of the tensile members would be pierced to allow electrical contact to the electronic components.

The invention also provides a continuous manufacturing method for integrated circuit cards, which comprises the steps of:

a) forming a pair of high tensile plastics webs into a tube and guiding said tube between an opposed pair of moving endless belts whose faces are adapted to co-operate to form a moving mould cavity therebetween;

b) attaching said electronic components to at least one elongate flexible member and guiding said at least one member within said tube between said endless belts such that the components are disposed at predetermined positions within said mould cavity;

c) injecting a reaction injection mouldable plastics material into said tube before it passes between said endless belts, such that the mould cavity is filled by said plastics material within said tube;

d) curing said plastics material during passage between said belts to produce a continuous band; and e) separating said continuous band into discrete integrated circuit cards.

Preferably, the edges of the webs are sealed to form a sealed structure within which the plastics material is allowed to harden. To protect the graphics on the labels or skins, the graphics may be printed or otherwise deposited on their inner surface, i.e. the surface contacting the plastics material. The provision of the skins serves both to strengthen a card, as the skin is of a sufficiently high tensile modulus as to make a card substantially rigid but flexible, typically of similar flexibility and rigidity to a standard laminated credit card, and also serves as a mould release agent since the plastics material, which may for example be an epoxy, polyurethane or a polyester, has an adhesive nature and thus problems can arise if this contacts the mould and adheres to it. However, it is important that the plastics material should adhere to the skins, or to graphics printed thereon.

The invention does provide apparatus for use in manufacturing an integrated circuit card comprising a plastics body having high tensile skins on two opposing main faces thereof and encapsulating an insert mounting at least one electronic component and digital input/output means, the apparatus comprising:

a) a pair of endless belts arranged such that a portion of the external face of one belt contacts a portion of the external face of the other belt, the external surfaces of the belts being shaped so as to define between the faces in contact a mould cavity;

b) drive means for moving the belts such that the faces move together while in contact;

c) means for forming a pair of high tensile plastics webs supplied from web supply means into a tube and for guiding said tube into said mould cavity;

d) means for supplying to the interior of said tube within said mould cavity at least one flexible member having a plurality of said inserts attached thereto at intervals along the length thereof;

e) a mixing head for mixing together the components of a reaction injection mouldable plastics material and for injecting the mix into said tube before it passes into said mould cavity; and f) means for supplying said components separately to said mixing head;

wherein the mould cavity is of a length such that, for a given speed of movement of the belts, the mouldable plastics material gels therein.

BRIEF DESCRIPTION OF THE DRAWINGS

Embodiments of the invention will now be described by way of example only with reference to the accompanying Figures, in which.

DETAILED DESCRIPTION OF THE PREFERRED EMBODIMENTS

Figure 1:
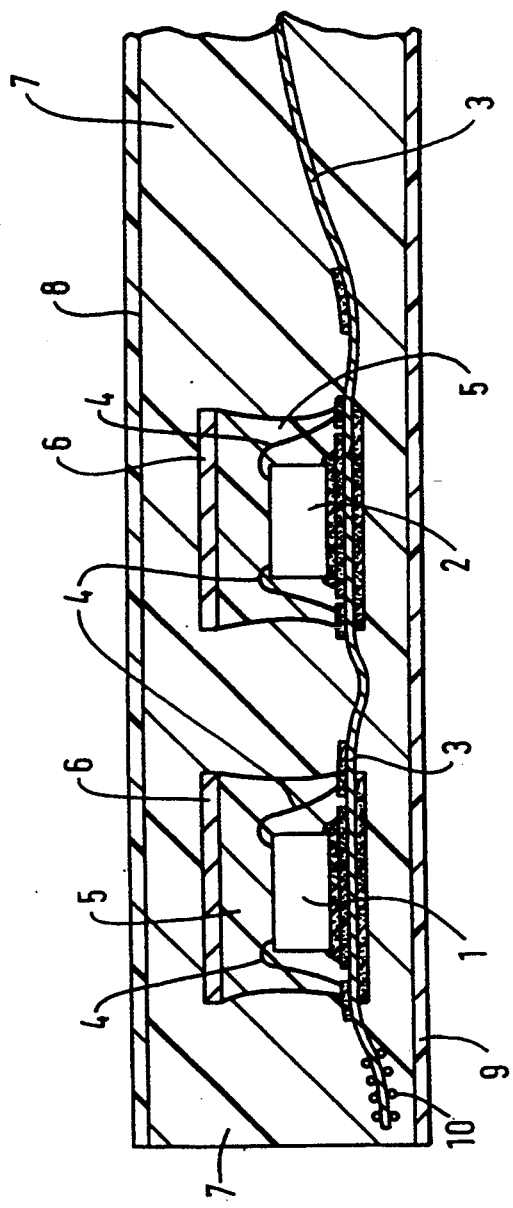
FIG. 1 shows schematically the cross section of an integrated circuit contactless card manufactured by a method according to the present invention.

Referring to FIG. 1, the card incorporates two or more electronic components, including an integrated circuit 1 and, for example a capacitor 2. The components 1 and 2 are mounted on a flexible substrate 3 upon which conductive tracks are formed, the components being connected to the tracks by wires 4. Each component is encased in a polymeric material 5 with a tensile member 6 thereon, and the whole insert, comprising the substrate 3 and the components mounted thereon, is in turn encased in a plastics body 7 having high tensile plastics skins 8 and 9 on the upper and lower surfaces thereof. The power and input/output requirements of such a card are achieved by means of inductive coils 10 mounted on the substrate 3 and disposed generally around the periphery of the card. The skins 8 and 9 are made of polyester, polycarbonate, polyimide or a material of a similar tensile modulus and, in addition to their function as labels bearing identifying and other indicia, also have a strengthening effect. Without the skins 8 and 9 the cards might be flaccid and their functions would probably be impaired. The indicia are preferably printed on the inner surfaces of transparent skins to protect them from abrasion in use.

The card is assembled by means of a moulding process known as reaction injection moulding (RIM). This is a well known process which is often used in the manufacture of large plastics articles such as car bumpers, surfboards and the like. The difference from conventional injection moulding techniques is that two reactive materials are used which are combined immediately before moulding. These are a resin and a hardener which, when combined together harden within a fixed time period which is dependent upon the constituents. With conventional injection moulding, heat and pressure are required to melt the resin and inject it into a mould, whereupon the resin sets as it cools. RIM is characterised by the fact that, since the resin and hardener mixture is a liquid at a low temperature, high pressure and temperature are not required.

In a first embodiment of the present invention the components of an array of cards, other than the liquid plastics material are fixed in place within a mould such that the labels are adjacent the sides of the mould, printed surface inward, and the other components lie between the labels. The resin and hardener are mixed together and then immediately injected into the mould at a low pressure and temperature. Since the resin is in a fluid state, typically having the consistency of for example milk or thin cream, then the resin flows throughout the mould, making good contact with all the components and eventually completely covering and encapsulating them. The mould is held at a temperature of about 100° C. and the resin/hardener mix begins to set after the fixed time period, perhaps two to ten minutes, although resins are available which can begin to set after a few seconds. After the resin has set, the complete array of cards is removed from the mould and the process can be repeated.

Since the resin is not allowed to contact the mould walls the labels act as a release from the mould cavity walls, but remain firmly adhered to the hardened resin body. To assist this adhesion, if necessary, the skins, which can be opaque and be coloured or white, are provided with a coating on the inner surfaces thereof of a blocked catalyst adhesive material which is activated at the mould temperature of 100° C. The layer is preferably used to attach the insert to one of the skins before injection into the mould of the resin/hardener mix. In this application the printed graphics are applied to the outside of the finished card.

Figure 2:
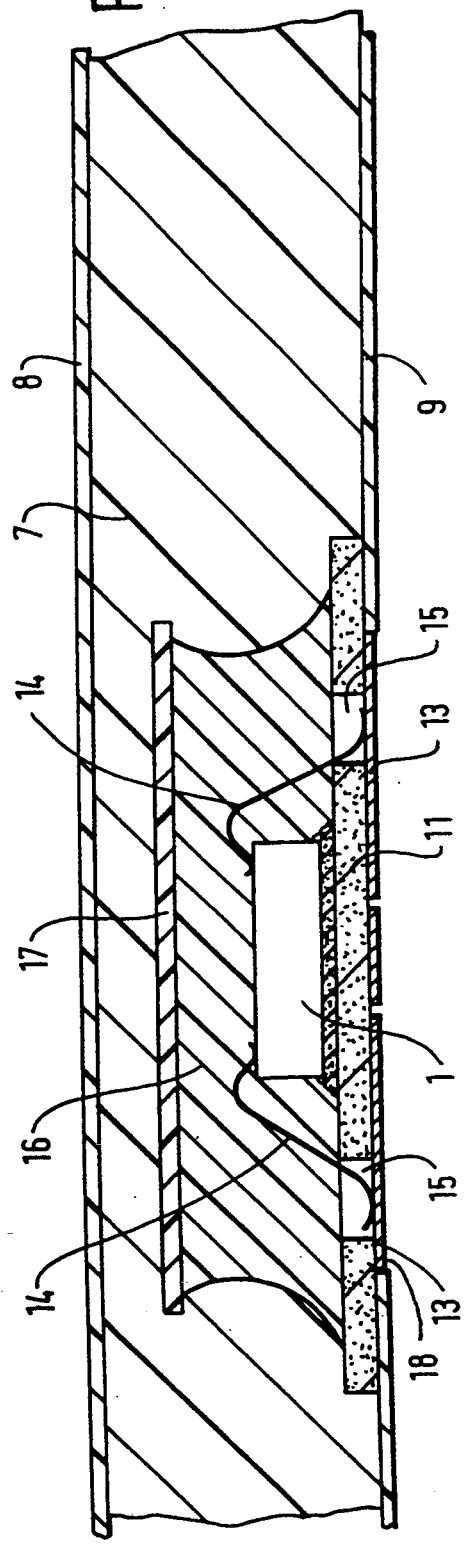
FIG. 2 shows schematically the cross-section of an integrated circuit contact card manufactured by a method according to the present invention.

Referring now to FIG. 2, an integrated circuit contact card has an integrated circuit 1 mounted on a glass-reinforced epoxy resin substrate 11 using an adhesive. The substrate 11 has a plurality of a separate copper contact pads 13 formed on its underside, to which the integrated circuit is connected via wire bonds 14 passing through holes 15 formed in the substrate. A polymeric material 16, of the type sometimes referred to as a "glob top" resin, encloses the circuit 1 and its wire bonds 14 on the substrate 11, and a polyester tensile member 17 is pressed on to the material 16 before it cures to limit its height and to add stiffening which resists damage during flexing of the card.

In formation of the card, the assembly, comprising the substrate 11 and the components thereon, is adhered to a high tensile plastics skin 9 in which an appropriate aperture or plurality of apertures 18 is formed to expose the contact pads 13 to the exterior of the card, when formed. The skin 9 is then placed over one face of a mould, with a second high tensile plastics skin 8 over the opposite face. The skins 8 and 9 are essentially the same as those described with reference to FIG. 1.

A liquid reaction injection moulding material is then injected into the mould between the skins 8 and 9 and the mould is closed slightly to ensure that the RIM material fills the space between the skins. The skins may be coated on their inner surfaces with a blocked catalyst adhesive material, as in the embodiment described with reference to FIG. 1, and the remainder of the process is carried out as described with reference to that Figure.

Figure 3:
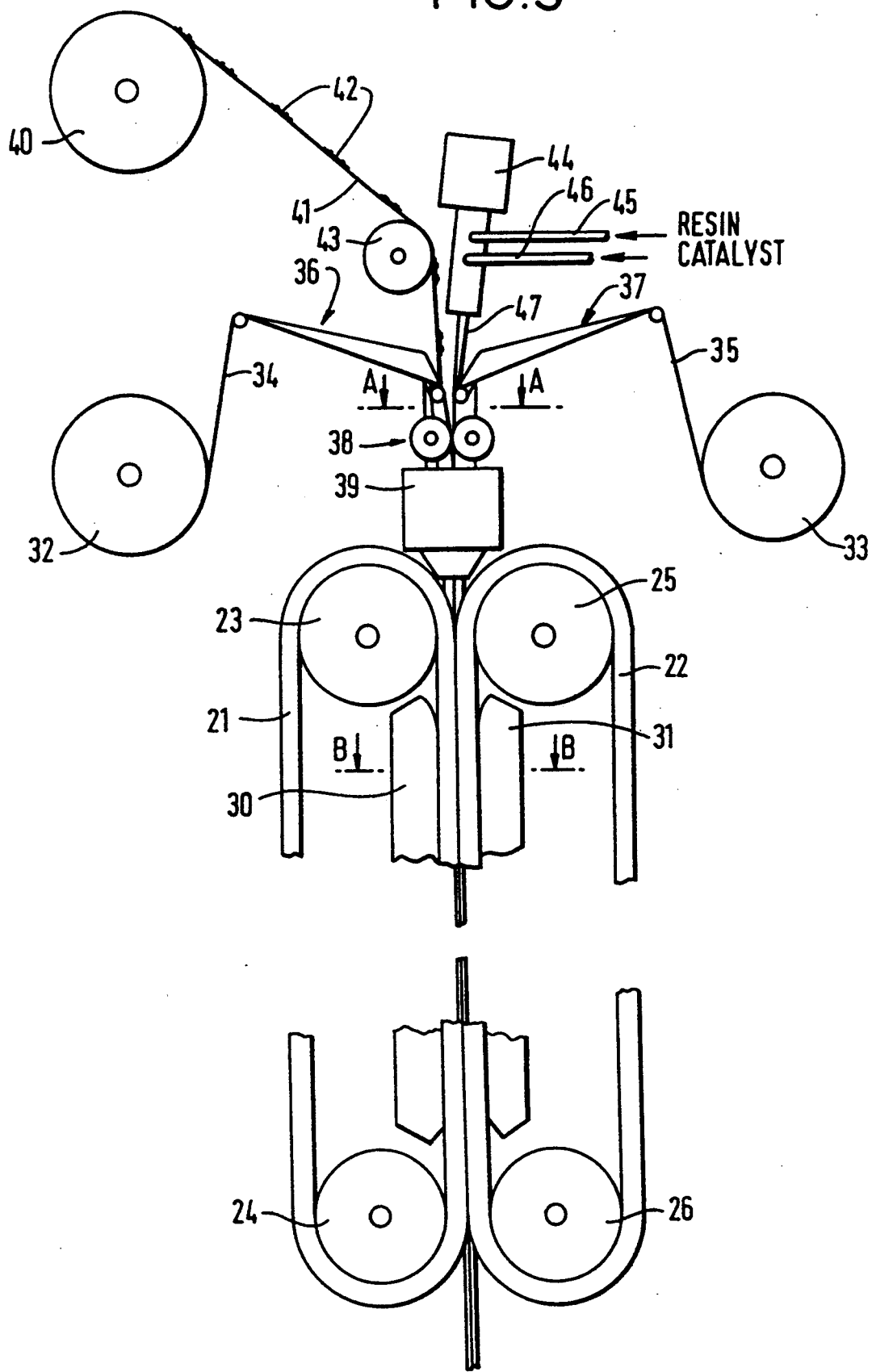
FIG. 3 illustrates schematically an apparatus for use in the method of the invention.
Figure 4:
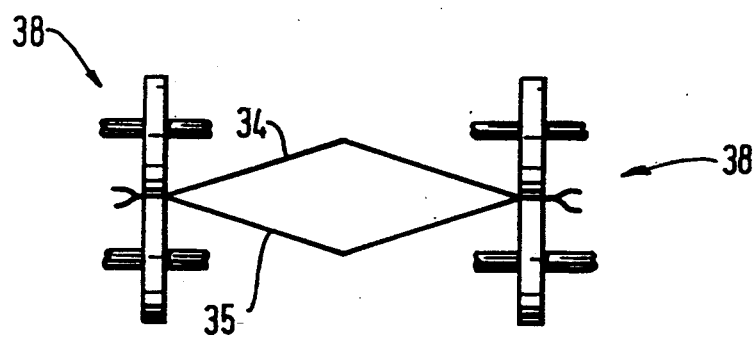
FIGS. 4 and 5 are sections respectively on A—A and B—B in FIG. 3.
Figure 5:
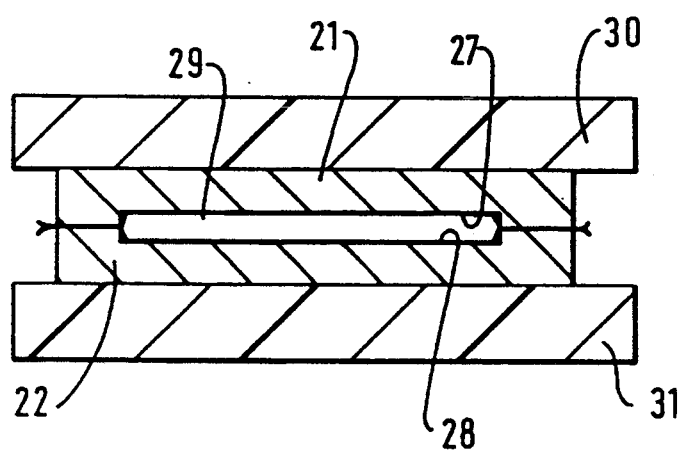

Referring now to FIGS. 3, 4 and 5, a preferred apparatus for carrying out the method of the invention permits continuous, instead of batchwise, manufacture of the cards. The apparatus comprises a pair of endless belts 21 and 22, passing over vertically spaced drive rollers 23 and 24, 25 and 26, respectively, and having their external faces in contact. The external face of each belt 21 and 22 (FIG. 4) is formed with a recessed portion 27 and 28 respectively which, when the surfaces are in contact, together define a mould cavity 29.

Heated shoes 30 and 31 press the belts together and heat the mould cavity to approximately 100° C.

Two spools 32 and 33 supply preprinted polyester webs 34 and 35 to form the high tensile skins of the cards. The webs 34 and 35 pass over respective formers 36 and 37 which form the webs into a tube (see FIG. 3), whose edges are sealed by heated pinch rollers 38 at 120° C. The tube is guided through a forming duct 39 which forms the tube into a flattened shape conforming with the mould cavity.

A third spool 40 is provided supplying a pair of threads 41 to which are fixed at regular intervals inserts 42, each of which comprises a flexible substrate 3 and components 1 and 2, as described with reference to FIG. 1. The inserts are attached to the threads 41 in a separate operation, in which the threads are first passed through a vat of liquid hot melt adhesive and then cooled in air to allow the adhesive to harden. The inserts 42 are then applied to the threads 41 at pre-determined intervals by nipping the insert and thread together at a point, using heated jaws, for a period sufficient to melt the adhesive and cause the insert to adhere thereto. The threads 41, with the inserts therebetween at intervals therealong, are then respooled. The threads 41 and inserts 42 pass from the spool 40 and over a guide roller 43 to be guided into the tube formed by the webs 34 and 35 within the mould cavity so as to position the inserts 42 correctly relative to the webs.

A dynamic mixing head 44, of a type conventional for the mixing of reaction injection mouldable materials, is supplied separately with resin and catalyst via feed pipes 45 and 46, and injects the mixed materials via a nozzle 47 into the tube at the point at which it is first formed; at a rate such that, after the tube has passed through the forming duct 39 and enters the mould cavity, it is filled with the mouldable material, which encapsulates the inserts 42.

The sealed edges of the tube pass between the belts at the portions on each side of the mould cavity 29, and the mouldable material cures, as the cavity moves downwards, under the influence of the heat supplied by the shoes 30 and 31, so that when the belts again separate the mouldable material has gelled and is dimensionally stable.

After further curing, the resultant solid strip comprising the moulded cards can be divided into individual cards by guillotining or by stamping with a suitably-shaped cutting punch and die.

I claim:

1. A method of manufacturing integrated circuit cards, each comprising at least one electronic component and data input/output means encapsulated within a plastics body having high tensile skins on two opposing main faces thereof, the method comprising the steps of:
   a) forming a pair of high tensile plastics webs into a tube and guiding said tube between an opposed pair of moving endless belts whose faces are adapted to co-operate to form a moving mold cavity therebetween;
   b) attaching said electronic components and said data input/output means to at least one elongate flexible member and guiding said at least one member within said tube between said endless belts such that said components and said data input/output means are disposed at predetermined positions within said mold cavity;
   c) injecting a reaction injection, moldable plastics material into said tube before it passes between said endless belts, such that the mold cavity is filled by said plastics material within said tube;
   d) curing said plastics material during passage between said belts to produce a continuous band of said integrated circuit cards; and
   e) separating said continuous band into discrete integrated circuit cards.

2. A method according to claim 1, wherein said at least one elongate flexible member is a filament or cord to which said electronic components and said data input/output means are attached by adhesive.

3. A method according to claim 2, which comprises pre-coating said filament or cord with a hot-melt adhesive and attaching said components and said data input/output means at intervals therealong by pressing the coated filament or card there against with a heated tool.

4. A method according to claim 1, comprising forming said high tensile webs into a tube by deflecting the webs over guides such that longitudinal edges of the webs are brought together with the webs bowed outwardly therebetween, and passing said edges between heated nip rollers to weld said edges together.

5. A method according to claim 1, comprising passing said endless belts between heating means to heat said cavities to accelerate hardening of said plastics material.

6. A method according to claim 5, wherein said heating means comprise a pair of heating plates pressed against said belts so as to press said belts together with said cavities therebetween.

* * * * *